(12) United States Patent
Li et al.

(10) Patent No.: US 7,064,418 B2
(45) Date of Patent: Jun. 20, 2006

(54) METHOD AND STRUCTURE OF DIODE

(75) Inventors: Ying-Hsin Li, Kaohsiung (TW); Sheng-Chieh Yang, Taoyuan (TW); An Shih, Changhua (TW); Ming-Dou Ker, Hsinchu (TW); Tang-Kui Tseng, Hsinchu (TW); Chih-Kang Deng, Taipei (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 131 days.

(21) Appl. No.: 10/781,879

(22) Filed: Feb. 20, 2004

(65) Prior Publication Data
US 2004/0164381 A1 Aug. 26, 2004

(30) Foreign Application Priority Data
Feb. 21, 2003 (TW) .................. 92103686 A

(51) Int. Cl.
*H01L 31/075* (2006.01)
*H01L 31/105* (2006.01)

(52) U.S. Cl. .............. 257/656; 257/355; 438/81

(58) Field of Classification Search .......... 257/656, 257/355
See application file for complete search history.

(56) References Cited

U.S. PATENT DOCUMENTS

| | | | |
|---|---|---|---|
| 5,610,790 A * | 3/1997 | Staab et al. ............ | 361/56 |
| 6,118,154 A * | 9/2000 | Yamaguchi et al. ...... | 257/360 |
| 6,329,691 B1 * | 12/2001 | Finzi .................. | 257/355 |
| 2001/0015445 A1 * | 8/2001 | Nemoto ................ | 257/138 |
| 2004/0105203 A1 * | 6/2004 | Ker et al. ............. | 361/56 |

* cited by examiner

*Primary Examiner*—Tu-Tu Ho
(74) *Attorney, Agent, or Firm*—Michael Bednarek; Pillsbury Winthrop Shaw Pittman LLP

(57) ABSTRACT

A method and a structure of a diode are provided. The diode is used in an electrostatic discharge protection circuit using TFT (Thin Film Transistor) fabrication technology. A semiconductor layer is formed on a substrate. A first region of a first carrier concentration is formed in the semiconductor layer. A second region of a second carrier concentration is formed in the semiconductor layer. An insulator is formed on the semiconductor layer. The insulator layer is etched to form at least a contact window. The contact window exposes a portion of an upper surface of the semiconductor layer. A metal layer is formed on the insulator layer. The metal layer fills up the contact window to contact the semiconductor layer.

7 Claims, 4 Drawing Sheets

METHOD AND STRUCTURE OF DIODE

CROSS REFERENCE TO RELATED APPLICATIONS

This application claims priority of Taiwan Patent Application Serial No. 092103686 filed on Feb. 21, 2003.

DIELD OF INVENTION

The present invention relates to a method and a structure of a diode. The diode is used in an electrostatic discharge protection circuit using TFT (thin film transistor) fabrication technology.

BACKGROUND OF THE INVENTION

There is usually a large amount of charges accumulated in electronic devices (e.g. display panels) during the process of transportation and at various other stages during and after the manufacturing process for such electronic devices. Such accumulation may expose the electronic devices to the impact of a high voltage and cause deteriorated performance or even breakdown of the devices or sometimes even physical injury to the users. Therefore, it is necessary to install electrostatic discharge (ESD) protection circuits in the electronic devices.

FIG. 1 shows an electrostatic discharge (ESD) protection circuit 100 adopted in the TFT fabrication process. This protection circuit 100 works through the use of thin film transistors 102, 104 and resistors 106, 108, 109 and 110. Because of the relative low tolerance of ESD energy for this transistor-resistor arrangement, the electronic discharge protection circuit 100 is not very effective in protecting the electronic devices from ESD.

SUMMARY OF THE INVENTION

The present invention provides a method and a structure of a diode. This diode is used in an electrostatic discharge protection circuit using conventional TFT fabrication technology. This diode can endure a higher ESD energy than the transistor-resistor arrangement previously mentioned and further reduce the possibility of ESD damages on the electronic devices.

The present invention lies in that the diode is used in an electrostatic discharge protection circuit using TFT fabrication process. Conventional TFT fabrication process can be applied to the fabrication of this diode, and no additional steps or masks are needed. Besides, the carrier concentration modulation is performed in the intrinsic region of the diode, so that the I–V characteristic of the diode is further improved.

The diode according to the present invention is used as part of an electrostatic discharge protection circuit using TFT fabrication process. The method of fabricating the diode includes the following steps. A semiconductor layer is formed on a substrate. A first region of a first carrier concentration is formed in the semiconductor layer. The first carrier concentration is of a first conductivity type. A second region of a second carrier concentration is formed in the semiconductor layer. The second carrier concentration is of a second conductivity type. An insulator is formed on the semiconductor layer. The insulator layer is etched to form at least one contact window. The contact window exposes a portion of the upper surface of a semiconductor layer. A metal layer is formed on the insulator layer. The metal layer fills up the contact window to contact the semiconductor layer.

The first region may be adjacent to the second region in the above-mentioned method or not. Besides, the second conductivity type is a negative type if the first conductivity type is a positive type, while the second conductivity type is a positive type if the first conductivity type is a negative type.

The above-mentioned method may further include forming a third region in the semiconductor layer before the step of forming the insulator layer. The third region may be intrinsic and located between the first region and the second region. The third region may alternatively be of a third carrier concentration. The third carrier concentration may be of the first conductivity type and may be lower than the first carrier concentration. Then the third region may be located between the first and the second region, and it can be adjacent to the first region.

The above-mentioned method may further include forming a fourth region in the semiconductor layer before the step of forming the insulator layer. The fourth region may be intrinsic and located between the third region and the second region. The fourth region may alternatively be of a fourth carrier concentration. The fourth carrier concentration may be of the second conductivity type and may be lower than the second carrier concentration. Then the fourth region may be located between the third and the second region, and it can be adjacent to the second region.

The above-mentioned method may further include forming a fifth region in the semiconductor layer before the step of forming the insulator layer. The fifth region may be intrinsic and located between the third region and the fourth region. The fifth region may alternatively be of a fifth carrier concentration. The fifth carrier concentration may be of the first conductivity type and may be lower than the third carrier concentration. Then the fifth region may be located between the third and the fourth region.

BRIEF DESCRIPTION OF THE DRAWINGS

For a more complete understanding of the present invention, reference is now made to the following descriptions taken in conjunction with the accompanying drawings. Similar notation number across

FIG. 3 is a cross-sectional diagram of a first exemplary embodiment of the present invention;

FIG. 4 is a cross-sectional diagram of a second exemplary embodiment of the present invention;

FIG. 5 is a cross-sectional diagram of a third exemplary embodiment of the present invention;

FIG. 6 is a cross-sectional diagram of a fourth exemplary embodiment of the present invention;

FIG. 7 is a cross-sectional diagram of a fifth exemplary embodiment of the present invention;

FIG. 8 is a cross-sectional diagram of a sixth exemplary embodiment of the present invention;

DETAILED DESCRIPTION

Figure 1:
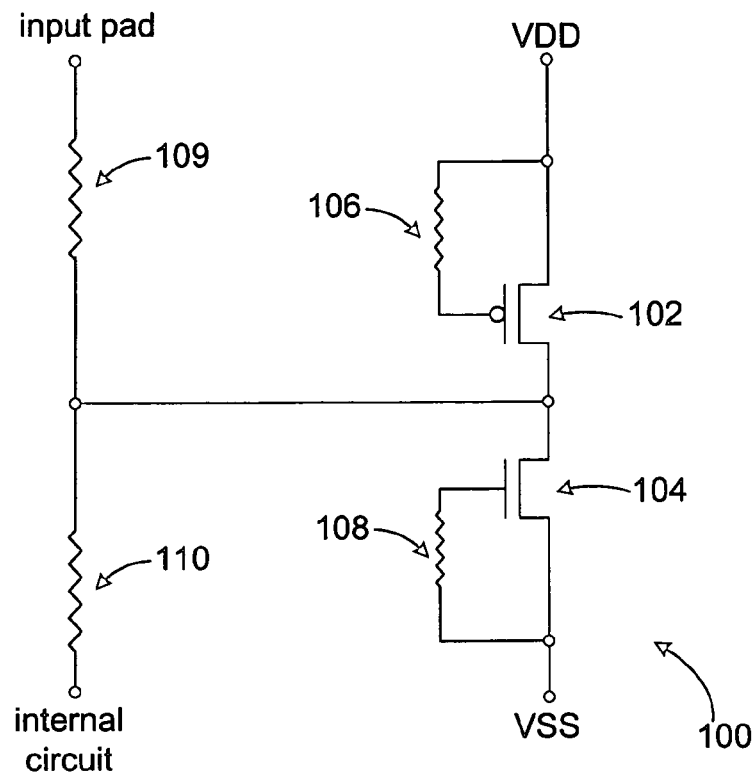
FIG. 1 is a schematic diagram of an electrostatic discharge protection circuit according to the prior art.
Figure 2:
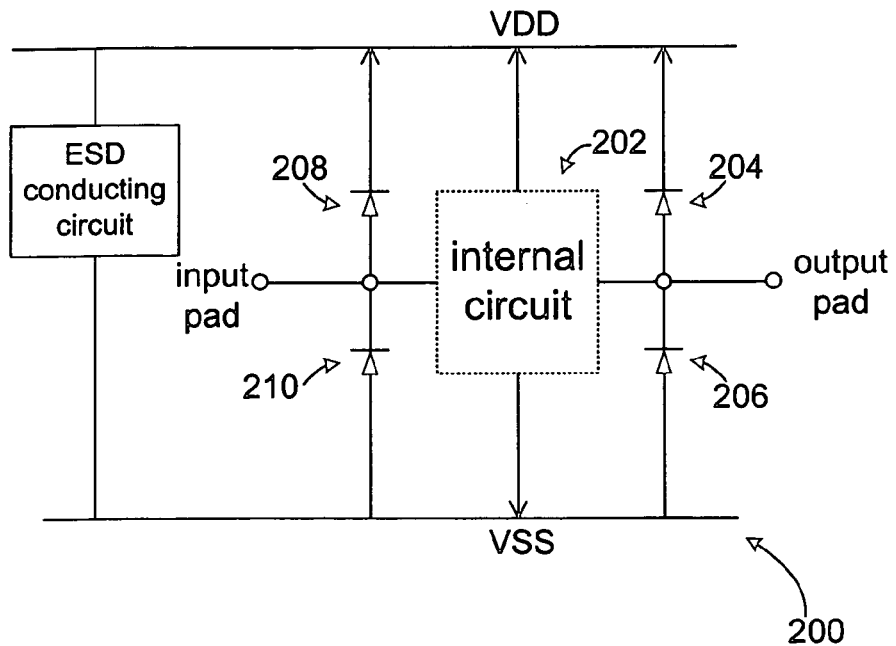
FIG. 2 is a schematic diagram showing an electrostatic discharge protection circuit applying the present invention.

FIG. 2 is a schematic diagram showing an embodiment of the electrostatic discharge protection circuit 200 applying the present invention. The diodes 204, 206, 208 and 210 according to the present invention are located among the internal circuit 202, VDD, and VSS to achieve protection. The carrier concentration modulation is performed in the intrinsic region of the diodes 204, 206, 208 and 210. The diodes 204, 206, 208 and 210 may utilize different carrier concentration to improve characteristic of endure high ESD energy.

Figure 3:
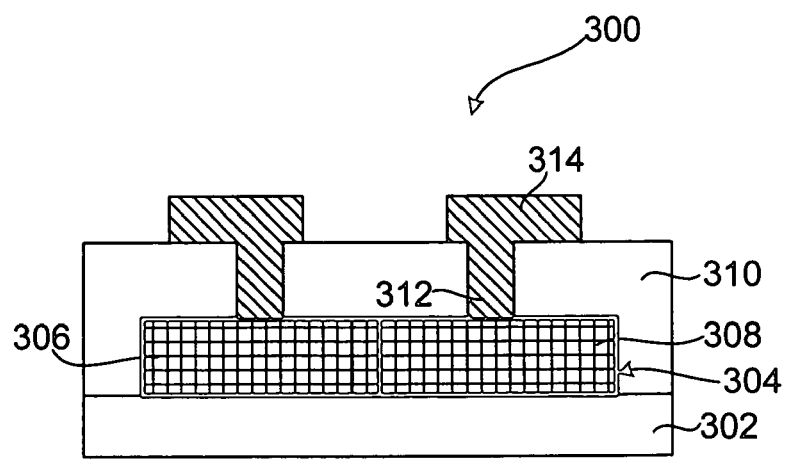
FIGS. 3–8 represents similar element.

FIG. 3 is a cross-sectional diagram of the first exemplary embodiment 300 of the present invention. This exemplary embodiment 300 includes a semiconductor layer 304, an insulator layer 310 and a metal layer 314. The semiconductor layer 304 includes a first region 306 of a first carrier concentration and a second region 308 of a second carrier concentration. The insulator layer 310 is disposed on the semiconductor layer 304 and includes at least one contact window 312. The metal layer 314 is disposed on the insulator layer 310. The contact window 312 exposes a portion of the upper surface of the semiconductor layer 304. The metal layer 314 fills up the contact window 312 to contact the semiconductor layer 304. The first carrier concentration is of the positive conductivity type. The second carrier concentration is of the negative conductivity type. The first region 306 is adjacent to the second region 308.

Figure 4:
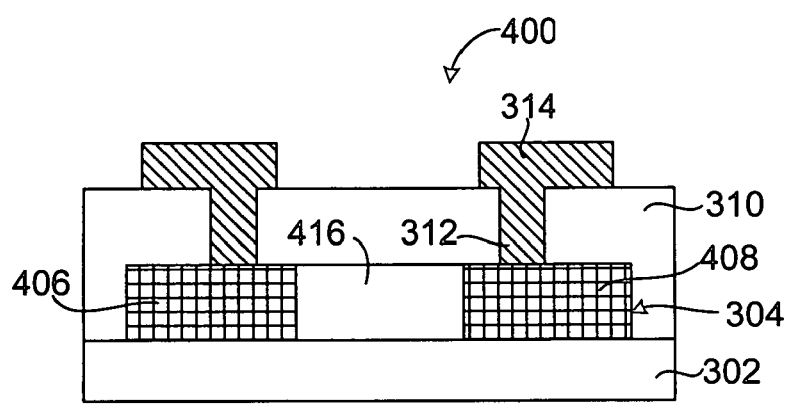

FIG. 4 is a cross-sectional diagram of the second exemplary embodiment 400 of the present invention. The semiconductor layer 304 of this exemplary embodiment 400 includes a first region 406 of a first carrier concentration and a second region 408 of a second carrier concentration. The first carrier concentration is of the positive conductivity type. The second carrier concentration is of the negative conductivity type. The first region 406 is not adjacent to the second region 408. A third region 416 is located between the first region 406 and the second region 408. In this exemplary embodiment 400, the third region 416 is intrinsic.

Figure 5:
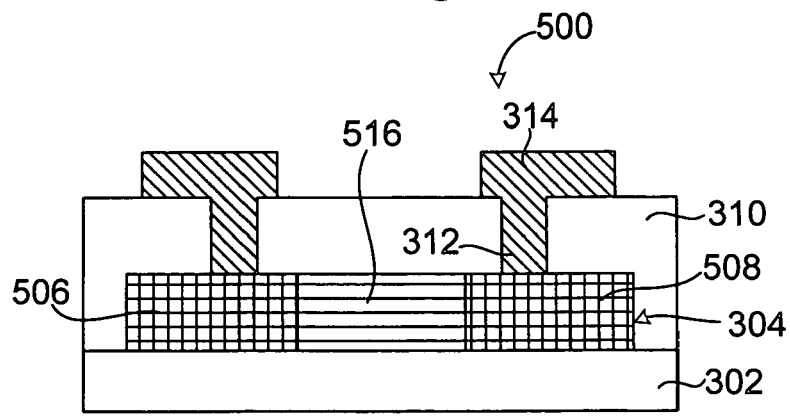

FIG. 5 is a cross-sectional diagram of the third exemplary embodiment 500 of the present invention. The semiconductor layer 304 of this exemplary embodiment 500 includes a first region 506 of a first carrier concentration, a second region 508 of a second carrier concentration and a third region 516 of a third carrier concentration. The first carrier concentration is of the positive conductivity type. The second carrier concentration is of the negative conductivity type. The third carrier concentration is of the positive conductivity type and is lower than the first carrier concentration. The third region 516 is located between the first region 506 and the second region 508, and is respectively adjacent to the first region 506 and the second region 508.

Figure 6:
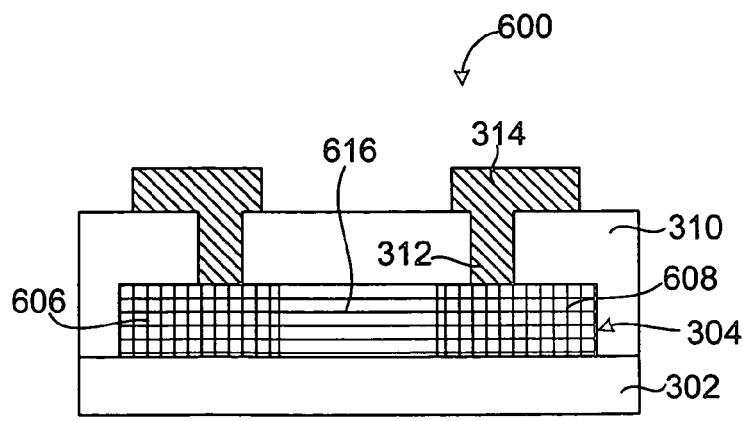

FIG. 6 is a cross-sectional diagram of the fourth exemplary embodiment 600 of the present invention. The semiconductor layer 304 of this exemplary embodiment 600 includes a first region 606 of a first carrier concentration, a second region 608 of a second carrier concentration and a third region 616 of a third carrier concentration. The first carrier concentration is of the positive conductivity type. The second carrier concentration is of the negative conductivity type. The third carrier concentration is of the negative conductivity type and is lower than the second carrier concentration. The third region 616 is located between the first region 606 and the second region 608, and is respectively adjacent to the first region 606 and the second region 608.

Figure 7:
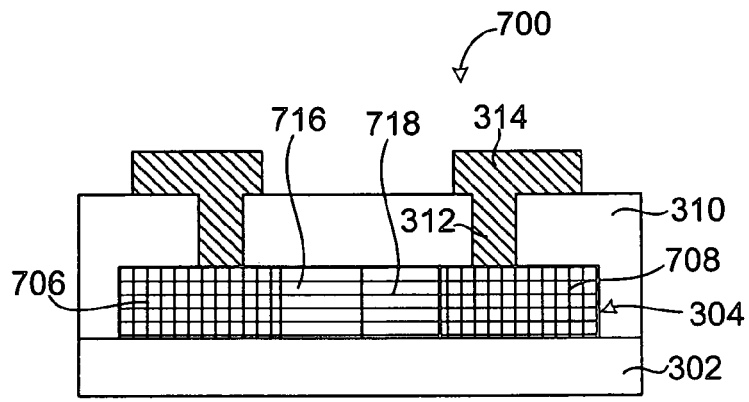

FIG. 7 is a cross-sectional diagram of the fifth exemplary embodiment 700 of the present invention. The semiconductor layer 304 of this exemplary embodiment 700 includes a first region 706 of a first carrier concentration, a second region 708 of a second carrier concentration, a third region 716 of a third carrier concentration and a fourth region 718 of a fourth carrier concentration. The first carrier concentration is of the positive conductivity type. The second carrier concentration is of the negative conductivity type. The third carrier concentration is of the positive conductivity type and is lower than the first carrier concentration. The fourth carrier concentration is of the negative conductivity type and is lower than the second carrier concentration. Both the third region 716 and the fourth region 718 are located between the first region 706 and the second region 708. The third region 716 is adjacent to the first region 706. The fourth region 718 is adjacent to the second region 708. The third region 716 is adjacent to the fourth region 718.

Figure 8:
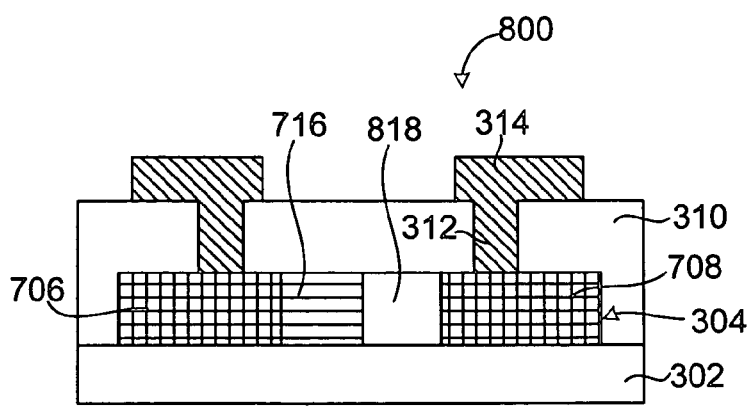

FIG. 8 is a cross-sectional diagram of the sixth exemplary embodiment 800 of the present invention. This exemplary embodiment 800 is similar to the fifth exemplary embodiment 700, while the difference between the embodiments 700 and 800 lies in that the fourth region 818 is intrinsic.

Figure 9:
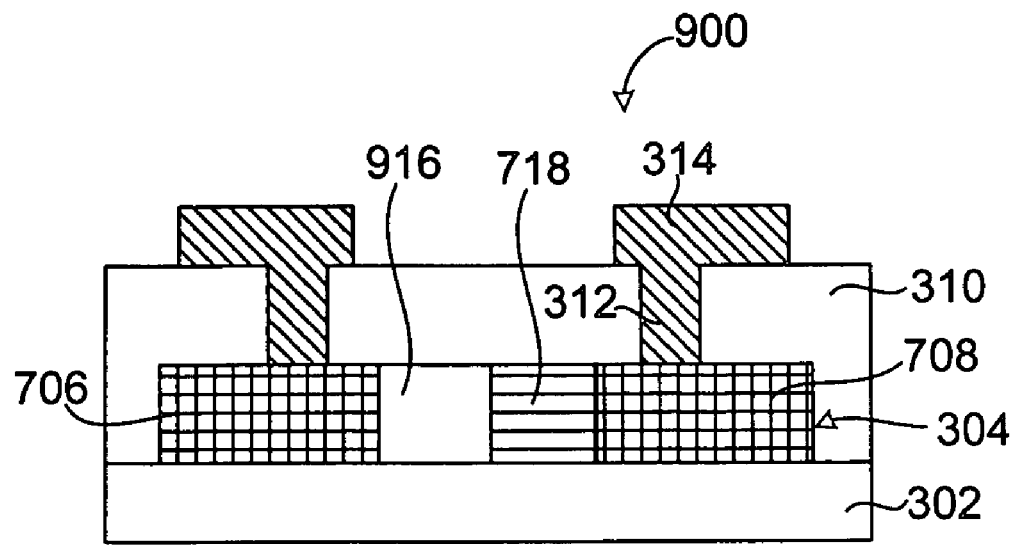
FIG. 9 is a cross-sectional diagram of a seventh exemplary embodiment of the present invention.

FIG. 9 is a cross-sectional diagram of the seventh exemplary embodiment 900 of the present invention. This exemplary embodiment 900 is similar to the fifth exemplary embodiment 700, while the difference between the embodiments 700 and 900 lies in that the third region 916 is intrinsic.

Figure 10:
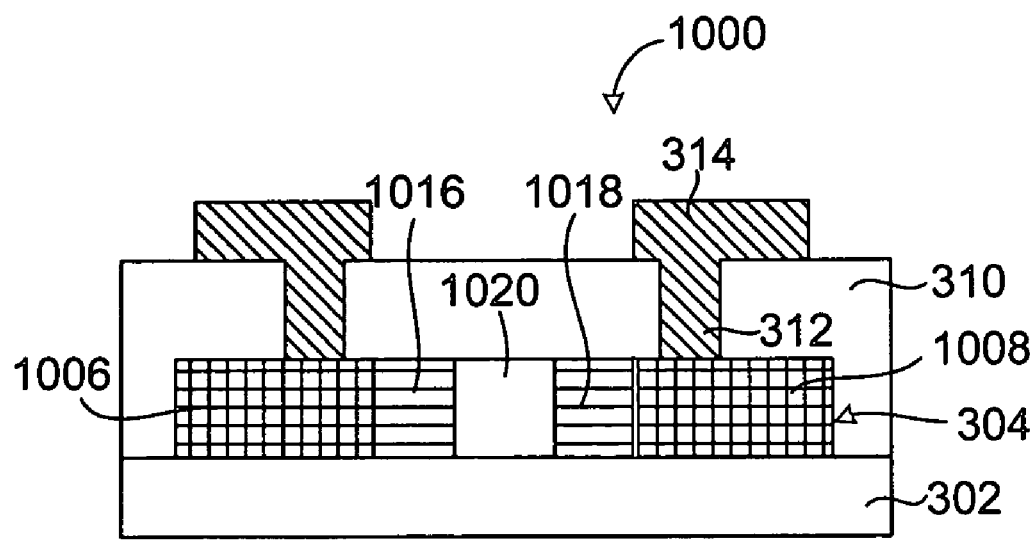
FIG. 10 is a cross-sectional diagram of an eighth exemplary embodiment of the present invention.

FIG. 10 is a cross-sectional diagram of the eighth exemplary embodiment 1000 of the present invention. The semiconductor layer 304 of this exemplary embodiment 1000 includes a first region 1006 of a first carrier concentration, a second region 1008 of a second carrier concentration, a third region 1016 of a third carrier concentration, a fourth region 1018 of a fourth carrier concentration and a fifth region 1020. The first carrier concentration is of the positive conductivity type. The second carrier concentration is of the negative conductivity type. The third carrier concentration is of the positive conductivity type and is lower than the first carrier concentration. The fourth carrier concentration is of the negative conductivity type and smaller than the second carrier concentration. Both the third region 1016 and the fourth region 1018 are located between the first region 1006 and the second region 1008. The third region 1016 is adjacent to the first region 1006. The fourth region 1018 is adjacent to the second region 1008. The third region 1016 is not adjacent to the fourth region 1018. The fifth region 1020 is located between the third region 1016 and the fourth region 1018. The fifth region 1020 is intrinsic in this embodiment 1000. However, the fifth region 1020 may alternatively be of a fifth carrier concentration. The fifth carrier concentration may be of the positive conductivity type and is lower than the third carrier concentration. The fifth carrier concentration may alternatively be of the negative conductivity type and is lower than the fourth carrier concentration.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

What is claimed is:

1. A method of fabricating a diode on a substrate, said method comprising:

forming a semiconductor layer on said substrate; forming a first region of a first carrier concentration in said semiconductor layer;

forming a second region of a second carrier concentration in said semiconductor layer;

forming a third region of a third carrier concentration in said semiconductor layer, said third carrier concentration is of a first conductivity type and is smaller than said first carrier concentration, said first region separates from said second region, said third region locates between said first region and said second region, said third region is adjacent to said first region;

forming a fourth region of a fourth carrier concentration in said semiconductor layer, said fourth carrier concentration is of a second conductivity type and is smaller than said second carrier concentration, said third region separates from said second region, said fourth region locates between said third region and said second region, said fourth region is adjacent to said second region;

forming a fifth region of a fifth carrier concentration in said semiconductor layer, wherein said fifth carrier concentration is of said first conductivity type and is smaller than said third carrier concentration, said third region separates from said fourth region, said fifth region locates between said third region and said fourth region;

forming an insulator layer on said semiconductor layer;

etching said insulator layer to form at least a contact window; and forming a metal layer on said insulator layer;

wherein said contact window exposes a portion of an upper surface of said semiconductor layer, said metal layer fills up said contact window to contact said semiconductor layer.

2. The method of claim 1, wherein said diode is formed by a thin-film transistor process, and said diode is applied to a circuit.

3. The method of claim 1, wherein said second conductivity type is a negative type if said first conductivity type is a positive type, said second conductivity type is a positive type if said first conductivity type is a negative type.

4. A diode, comprising:

a semiconductor layer, comprising:

a first region of a first carrier concentration, wherein said first carrier concentration is of a first conductivity type;

a second region of a second carrier concentration, wherein said second carrier concentration is of a second conductivity type;

a third region of a third carrier concentration, wherein said third carrier concentration is of said first conductivity type and is smaller than said first carrier concentration, said first region separates from said second region, said third region locates between said first region and said second region, said third region is adjacent to said first region;

a fourth region of a fourth carrier concentration, wherein said fourth carrier concentration is of said second conductivity type and is smaller than said second carrier concentration, said third region separates from said second region, said fourth region locates between said third region and said second region; and said fourth region is adjacent to said second region;

a fifth region of a fifth carrier concentration, wherein said fifth carrier concentration is of said first conductivity type and is smaller than said third carrier concentration, said third region separates from said fourth region, said fifth region locates between said third region and said fourth region;

an insulator layer disposed on said semiconductor layer, said insulator layer including at least a contact window; and a metal layer disposed on said insulator layer;

wherein said contact window exposes a portion of an upper surface of said semiconductor layer, said metal layer fills up said contact window to contact said semiconductor layer.

5. The diode of claim 4, wherein said diode is formed by a thin-film transistor process, said diode is applied to a circuit.

6. The diode of claim 4, wherein said second conductivity type is a negative type if said first conductivity type is a positive type, said second conductivity type is a positive type if said first conductivity type is a negative type.

7. An electrostatic discharge protection circuit, comprising a diode as described in claim 4.

* * * * *